United States Patent [19]

Pillsbury et al.

[11] Patent Number: 5,101,412
[45] Date of Patent: Mar. 31, 1992

[54] LASER DIODE SOURCE ASSEMBLY

[75] Inventors: Allen D. Pillsbury, Foxboro, Mass.; Michael F. Richardson, Fairfield, Iowa; David Welford, Middleton, Mass.

[73] Assignee: Massachusetts Institute of Technology, Cambridge, Mass.

[21] Appl. No.: 625,785

[22] Filed: Dec. 10, 1990

Related U.S. Application Data

[60] Continuation of Ser. No. 382,246, Jul. 19, 1989, abandoned, which is a division of Ser. No. 203,310, Jun. 6, 1988, Pat. No. 4,910,741.

[51] Int. Cl.$^5$ ................................................ H01S 3/10
[52] U.S. Cl. ...................................... 372/34; 372/32; 372/20
[58] Field of Search ...................... 372/36, 101, 29, 20, 372/32, 34; 357/74, 81

[56] References Cited

U.S. PATENT DOCUMENTS 4,517,585  5/1985  Ridout et al. ......................... 357/81
4,627,068 12/1986  Johnson et al. ...................... 372/101

Primary Examiner—James W. Davie
Attorney, Agent, or Firm—Fish & Richardson

[57] ABSTRACT

A frequency tunable, athermal, laser diode source assembly, having a collimating lens coupled via a thermally compensating apparatus to a laser diode, the lens and diode mounted in a temperature compensating structure. A temperature controller controls the operating temperature and frequency of the diode. The assembly is ruggedized for hostile environments.

3 Claims, 3 Drawing Sheets

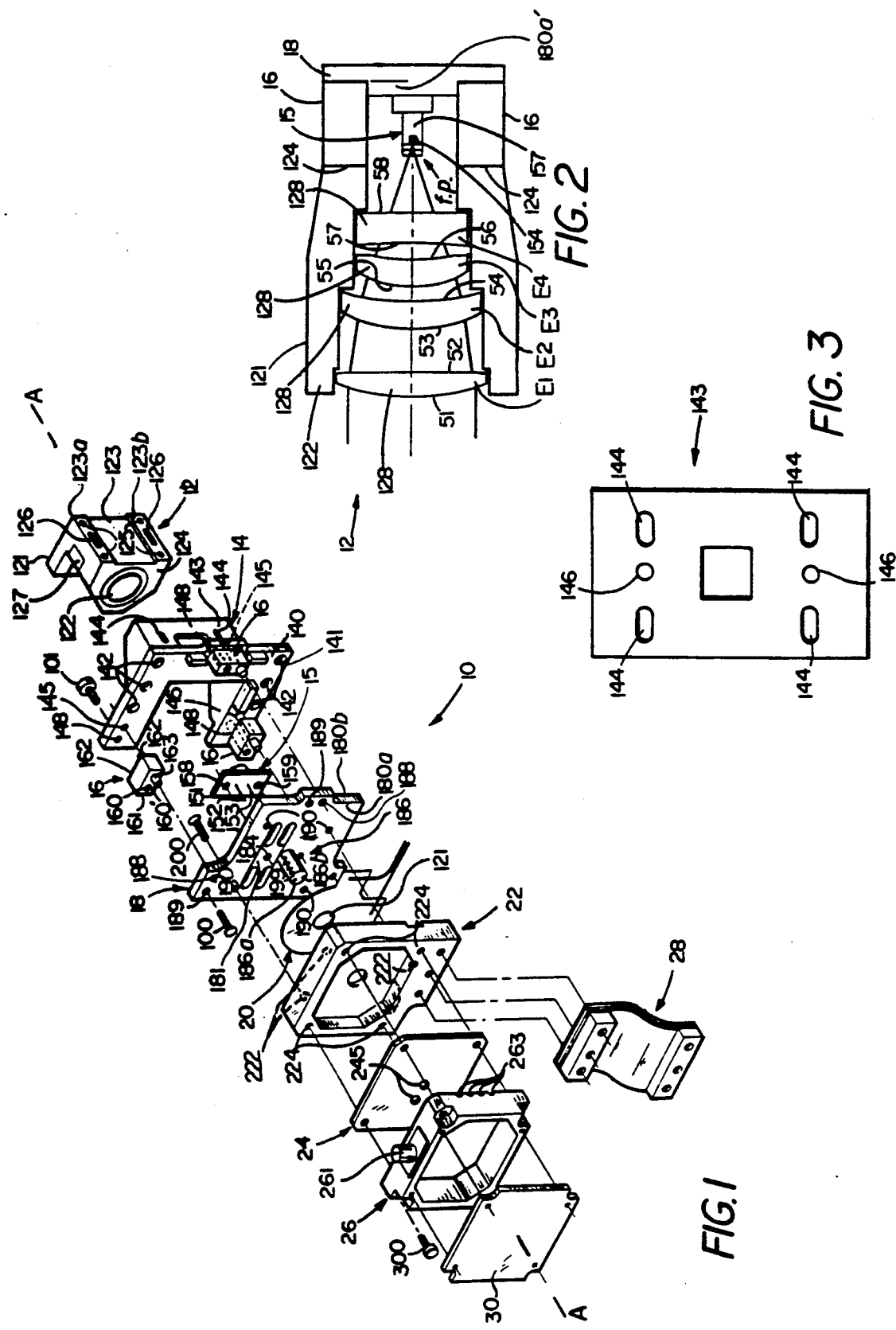

LASER DIODE SOURCE ASSEMBLY

The U.S. Government has non-exclusive rights in this invention pursuant to Contract Number F19628-85-C-0002, awarded by the Department of the Air Force.

This is a continuation of application Ser. No. 07/382,246, filed July 19, 1989, now abandoned, which is a divisional of application Ser. No. 07/203,310, filed June 6, 1988, U.S. Pat. No. 4,910,741.

BACKGROUND OF THE INVENTION

The present invention relates to semiconductor lasers, and more particularly, to a ruggedized, tunable, athermal laser diode source assembly.

The advent of lasers as a source of coherent light has enabled design of highly accurate devices for timing, measuring, switching, and various other functions of optical information transmission and processing. Of particular note is the high degree of efficiency achievable with laser diodes, even when operated at high switching rates.

A laser diode source assembly can be thought of as a sophisticated housing for a simple diode laser. It collimates the rapidly diverging beam from the laser, preferably with minimal loss in laser power. A typical source assembly might include a collimating lens supported in fixed relation to a diode laser source. The diode in turn is typically driven by a local electronics package. Where all of these elements are combined together in a single assembly, however, any heat generated within this assembly, or even external thermal gradients, can cause physical device changes as will degrade component performance, or as can defocus the assembly.

It is known to provide thermal compensation to aid in maintaining the frequency of operation of a laser. In a gross attempt, cooling chambers can be employed within which a source assembly can be operated with diminished thermal anomalies. However, this can prove to be cumbersome and expensive, at least from the standpoint of supporting equipment.

As well, a laser diode source assembly is limited in value if it cannot tolerate real world insults. These insults include those imposed during transportation, installation and use. A source assembly must be particularly hearty if it will be subjected to airborne distresses, such as high gravity forces and vibrations of rocket lift-off, etc.

In fact, there is a felt need and a ready market for an athermal, ruggedized, frequency tunable laser source with good power output (on the order of 25 mW at a 0.86 micron wavelength) with a high degree of frequency stability.

SUMMARY OF THE INVENTION

According to a first aspect of the present invention, a laser diode source assembly includes a collimating lens and a laser diode, the lens and diode mounted in a thermally compensating structure where a temperature control network is provided to maintain and control operating temperature of the diode.

In a second aspect of the present invention, the assembly maintains laser frequency and focus even under changes in temperature of the collimator and laser, and is adjustable in both frequency and operating temperature. The assembly has inputs for modulation, DC bias, and temperature control signals.

In a third aspect of the present invention, a source assembly provides passive radial and axial compensation against temperature-caused defocusing and decentering forces, where the device can be ruggedized by application of hardening compound at specially designed sites after alignment, and where provision is also made for optimal transmission line matching at the diode base.

BRIEF DESCRIPTION OF THE DRAWINGS

FIG. 1 is an exploded isometric view of a preferred embodiment of a source assembly 10;

FIG. 2 is a side cross-sectional view of a conceptual arrangement of lens array 12 coupled to diode on plate 18 via spacers 16, where support 14 has been omitted to direct attention to temperature compensation features of the present invention;

FIG. 3 is a plan view of the interior of flange 143 of support structure 14;

DESCRIPTION OF THE PREFERRED EMBODIMENT

Figure 4:
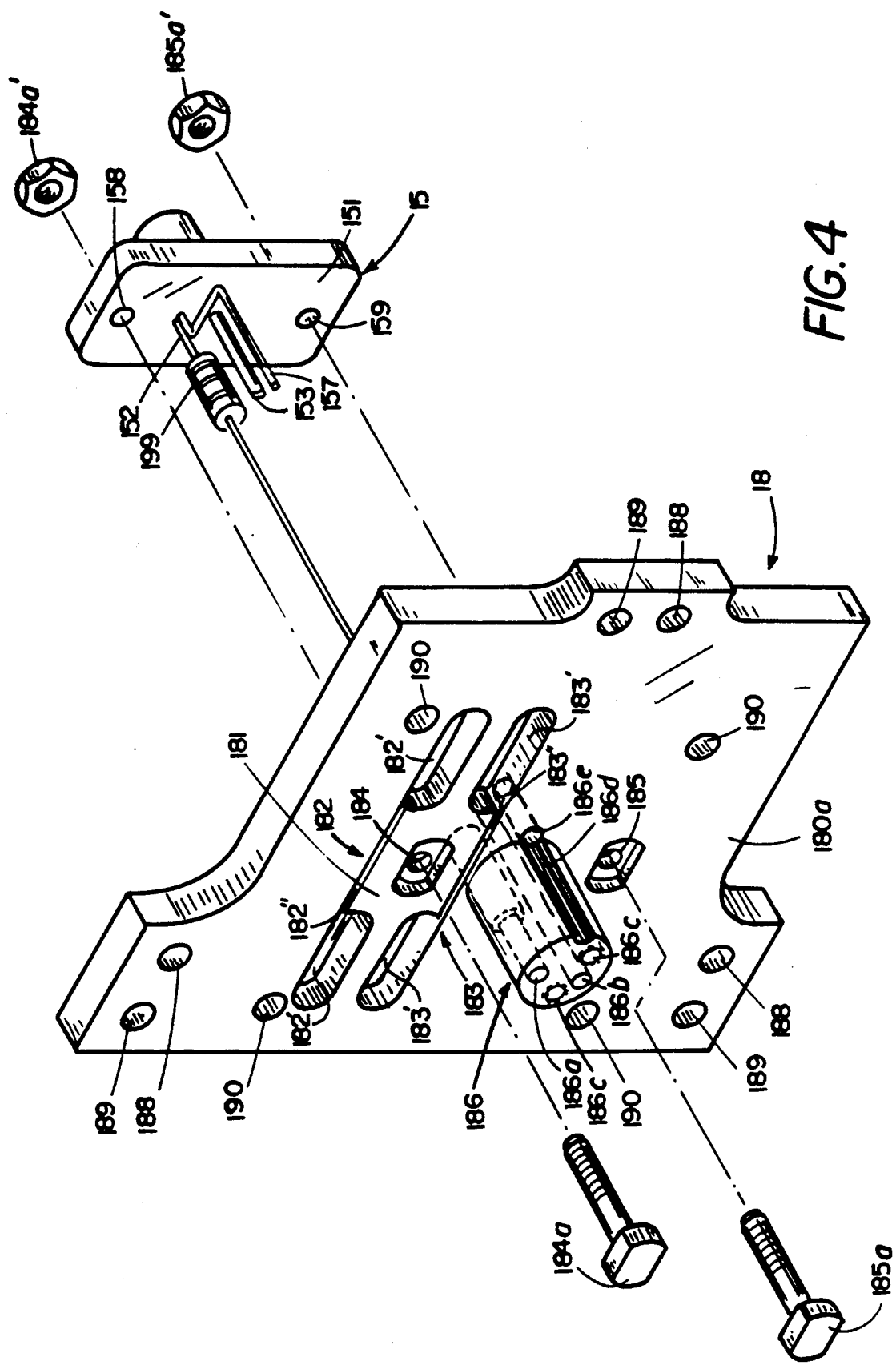
FIG. 4 is an exploded isometric view of diode mounting plate 18 cooperating with diode 15.

Referring to FIG. 1, an exploded isometric view of a preferred embodiment of the present invention is shown where laser diode source assembly 10 is presented having an optical axis A—A. FIG. 1 discloses a collimating lens array 12 sharing with assembly 10 the same optical axis A—A and disposed for coupling to a support structure 14, the latter in turn mounted to diode mounting plate 18 by means of three thermal compensation spacers 16. Coupled to plate 18 is a heater element 20 mounted to a first side of heater block 22, where DC bias electronics board 24 and electronics housing 26 are coupled to a second side of block 22, all centered in alignment, again, with axis A—A. Diode 15 is mounted to plate 18, where its emitter is centered at axis A—A. Heat strap 28 is coupled to the assembly at heater block 22.

More particularly, collimator lens array 12 comprises housing 121 having a vertical backface 124. Defined within housing 121 is a barrel 122 longitudinally centered about axis A—A, and perpendicular to face 124. Also shown is a sidewall 123, comprising raised coupling structures 123a, 123b, normal to face 124. Collimator lens array 12 is affixed to support structure 14 in a manner to be explained later. Furthermore, coupling structures 123a, 123b, each define a respective pair of threaded bores 125 and a respective alignment-pin-receiver 126. Receivers 126 each comprise a hollow structure provided with rear access at a channel 127 (only one shown), for purposes described later.

As will be understood by those skilled in the art, collimator lens array 12 will comprise appropriate optics as will satisfy an optical prescription under the constraints of low signal loss, low feedback to the laser and low optical aberration. In a preferred embodiment, collimator 12 is provided with four elements of radiation-hard, cerium-doped, SF6/G5 glass.

Turning to FIG. 2, there is shown a side cross-sectional view of a conceptual arrangement of lens array 12 coupled via spacers 16 to diode mounting plate 18. In fact, lens array 12 is coupled via support structure 14 to spacers 16, as will be seen upon reference to FIG. 1.

However, for purposes of FIG. 2, support 14 has been omitted to direct attention to temperature compensation features of the present invention, which will be more fully described in due course.

In any event, it will be appreciated that array 12 is preferably provided with four elements E1-E4. These elements are mounted within barrel 122 in a manner contrived to maintain the tilt, decenter, and air space thickness tolerances listed in Table 1. In a preferred embodiment, the distance from the barrel to the plane of the focal point of the array is preferably 3.6 millimeters. Preferably the lens barrel is constructed in a manner that temperature variations of +/− 10 degrees about 20° Celsius will not decenter the lens elements by more than 10 microns. Provision of weep holes (not shown), to allow air to escape from between the lens elements, is also desirable.

TABLE 1 a) Centered Tolerances

| ELEMENT NO. | SUR-FACE | RADIUS | FRINGES POW/IRR | THICKNESS |
|---|---|---|---|---|
| E1 | S1 | 31.062 | 0.2/0.1 | 1.700 |
| E1 | S2 | 202.219 | 0.2/0.1 | 3.535 |
| E2 | S3 | 14.448 | 0.2/0.1 | 2.527 |
| E2 | S4 | 16.411 | 0.2/0.1 | 0.682 |
| E3 | S5 | 7.665 | 0.2/0.1 | 2.200 |
| E3 | S6 | 13.9410 | 0.2/0.1 | 1.000 |
| E4 | S7 | INF | 0.2/0.1 | 3.356 |
| E4 | S8 | INF | 0.2/0.1 | 5.567 | b) Decentered Tolerances

| ELE-MENT NO. | ELEMENT WEDGE | | ELEMENT TILT | | DECENTER MM. |
|---|---|---|---|---|---|
| | TIR | ARC MIN | TIR | ARC MIN | |
| E1 | 0.010 | 2.9 | 0.0295 | 8.6 | 0.020 |
| E2 | 0.010 | 3.6 | 0.0240 | 8.6 | 0.020 |
| E3 | 0.010 | 4.3 | 0.0079 | 3.4 | 0.010 |
| E4 | 0.002 | 1.2 | 0.0058 | 3.4 | 0.020 |

Referring now to Table 1, it will be understood that particularly desirable specifications of elements E1-E4 are disclosed, where radius and thickness are given in millimeters, fringes of power and irregularity are at 546.1 nanometers over the clear aperture, irregularity is defined as fringes of cylinder power in test plate fit, and Total Internal Reflection (TIR) is measured parallel to the optical axis in millimeters at the smaller of the clear apertures. Thickness tolerance for all surfaces is 0.010 microns.

It will thus be appreciated that, for example, as detailed in Table 1, element E1 is preferably ground where surfaces S1 and S2, respectively, have centered tolerances in radius of 31.062 and 202.219 millimeters, with fringes of power and irregularity of 0.2/0.1, and with thickness at 1.700 and 3.535, +/− 0.0010 microns. Element E1 is also constrained to decentered tolerances of TIR 0.010, Arc Min 2.9 for element wedge, TIR 0.0295, Arc Min 8.6 for element tilt, and 0.020 for element decenter. Table 1 is read in a similar manner for the remaining elements E2-E4.

Referring again to FIG. 1, support structure 14 comprises base plate 141 having face 140, upon which are to be affixed the three thermal compensation spacers 16. Flange 143 is perpendicular to plate 141 (and thus parallel to Axis A—A) and is disposed for fixed attachment with collimator lens 12. Also located on face 140 are six bores 142 which provide for mounting of the invention to any desired fixture.

Turning briefly to FIG. 3, there is presented a plan view of the interior of flange 143, where it will be appreciated that four bores 144 have been defined therein. Also provided are two alignment pins 146, each of which rise perpendicular to the inner face 147 of flange 143, preferably approximately ¼" in elevation.

Returning again to FIG. 1, it is seen that support structure 14 also defines three pin receivers 145, where two of which are shown in phantom lining. As well, structure 14 defines three threaded bores 148, where two of which are shown in phantom lining. All such pin receivers 145 and threaded bores 148 are respectively aligned to be parallel to Axis A—A.

The three thermal compensation spacers 16 are each constructed having parallel opposed faces 160, 162, with bore 161 orthogonally defined therebetween. Pin 163 also intersects faces 160 and 162 at right angles and terminates at projections 160' and 162', where projection 160' extends out from face 160 and pin 162' extends out from face 162, the functions of which will be more clearly set forth below.

Diode mounting plate 18 has two faces 180a, 180b, and defines therein a reed-like flexure 181. Turning to FIG. 4, which is an exploded isometric view of diode mounting plate 18 cooperating with diode 15, flexure 181 will be seen in detail. It will be understood that symmetrically opposed recesses 182, 183, are defined in plate 18, where reed 181 is cut into plate 18. Recess 182 is defined by two openings 182', connected via channel 182''. Recess 183 is similarly defined by two openings 183', connected via channel 183''. As a result, it will be appreciated that reed 181 is formed capable of flexing action as more particularly discussed below.

Bores 184, 185 are provided to receive, respectively, threaded studs 184a, 185a. These studs are permanently pressed into bores 184, 185. Plate 18 also defines three pin receivers 188, and three bores 189, and four bores 190. Snout 186 is provided with two bores 186a, 186b, and two threaded bores 186c. Snout 186 also defines a longitudinal channel 186d, which terminates at bore 186e in plate 18. The functions of the foregoing will be more particularly set forth below.

Turning briefly to FIG. 2, the side cross-sectional view of plate 18 shows an integral spacer 180a' defined by face 180a as part of plate 18. It is upon this spacer 180a' that diode 15 is mounted. It will be appreciated that as spacer 180a' expands and contracts, it facilitates axial displacement of diode 15 mounted thereon, relative to plate 18, for purposes described below.

Heater element 20 preferably comprises a common foil-type resistance heater. Heater block 22 acts as a bulk heat source so as to smooth out the peaks of the thermal output of heater element 20 across plate 18. Heater block 22 preferably contains a shallow pocket (not shown) to enable flush mounting of element 20 in block 22 against plate 18. The heater element defines an opening 121 in its midsection and is mounted thereat centered at snout 186. Four threaded bores 222 (in phantom lining) and four threaded bores 224 are also provided in plate 22, the function of which are described below.

Block 22 also provides stability against heat generated by the DC bias electronics board 24. Furthermore, heat strap 28 is mounted to block 22 as seen in FIG. 1 for the purpose of drawing heat generated at board 24, element 20 and diode 15 away from the diode and lens array. The heat strap preferably has the characteristic of being flexible in all directions of stress.

Board 24 is mounted in housing 26, the latter having coaxial connector 261 mounted thereon, and channels 263 defined therein, as seen in FIG. 1. It will be appreciated by those skilled in the art that board 24 comprises an electronic network for DC bias control of diode 15. RF modulation signals are inputted via connector 261 to the diode. Regulated power is applied to board 24 by means of wires soldered to board 24 and passed along channels 263 to external hardware (not shown).

Returning again to FIG. 4, it will be seen that diode 15 has a base 151 which at a first end defines a bore 158 and thereat is to be bolted to flexure 181 at stud 184a by means of nut 184a'. The other end of diode base 151 defines bore 159 and thereat is to be bolted to plate 18 at stud 185a by means of nut 185a'. By means of this kinematic arrangement, it is possible to limit mechanical distortions of diode 15, since the diode is not overly constrained. The flexure makes allowance for the differences in coefficients of expansion of plate 18 and diode 15, such that flexure 181 can absorb radial displacement of diode base 151 relative to plate 18, upon local temperature changes.

Laser diode 15 is preferably a Hitachi HL8314CSP, operated with single mode emission near 0.86 microns, with linewidth less than 7 mhz, and output power of 30 mw or greater. This device incorporates a laser diode and an internal photo detector which may be employed as a laser power monitor (the detector not being shown). Base 151 provides electrical ground to device 15, while leads 152 and 153 provide electrical access to the laser itself and to the internal power monitor, respectively.

Diode 15 is mounted to plate 18 such that its electrical leads 152 and 153 can cooperate with snout 186. Snout passage 186a is further bored out to receive the body of a fixed resistor 199 having a value of 47 ohms. A first lead of resistor 199 is connected to diode lead 152 at the base of diode 15, where an additional bus wire 157 is also attached. The second lead of resistor 199 is connected to RF input connector 261 via bore 186a and board 24, for transmission of a modulation signal to the diode.

It will be appreciated that the diode internal impedance is about three ohms. By coupling resistor 199 in very close proximity to diode 15, the diode assumes a preferred effective source impedance of 50 ohms, which becomes advantageous in transmission line matching.

Furthermore, it will be understood that diode 15 will be coupled to board 24 directly at lead 152 via bus wire 157 running through bore 186e and in channel 186d, from the diode to the board, thereby allowing a DC biasing voltage to be introduced from board 24 directly into the diode, bypassing resistor 199.

The internal power monitor of diode 15 will be coupled to board 24 directly at lead 153 via bore 186b, and is communicated off-board by means of a shielded wire directed via channel 263 to an external power monitor circuit (not shown). Two screws (not shown) physically secure board 24 through its bores 245 to snout 186 at two threaded bores 186c, thus also providing for electrical ground connection between diode 15 and board 24.

Special attention must be paid to assembly of the various elements of the invention 10. In this manner, diode 15 and lens array 12 will be precisely positioned, axially and radially, for optimal performance. In part, this is resolved into particular rigid and fixed mounting described more fully below, and in part attributed to function of the temperature compensating features of the invention, also further described below.

Collimating lens array 12 is mounted to support structure 14 at flange 143 thereof, where lens array 12 abuts flange 143 such that pins 146 mate with receivers 126, respectively, and is secured in such abutted condition by means of a respective bolt (not shown) passing through a respective receiver 144 of support structure 14 and threadedly tightened into a respective threaded bore 125 of array 12.

Referring to FIG. 1, it will be seen that plate 18 is coupled to structure 14 by means of the three spacers 16. Face 162 of a first spacer 16 mounts flush against face 140 of structure 14 wherein pin 162' is forced to be frictionally engaged at receiver 145. This same spacer 16 at its face 160 mounts flush against face 180b of plate 18 where pin 160' loosely and freely engages receiver 188. The remaining two spacers 16 are frictionally affixed in a like manner at respective receivers 145 of support 14 and are freely coupled at respective receivers 188 of plate 18. As well, each respective one of three bolts 100 (only one shown) mounts through a respective bore 189 of plate 18 and threads into a first end of a respective threaded bore 161 of spacer 16, to facilitate fixed and threaded attachment between plate 18 and spacer 16. An additional three bolts 101 secure the spacers 16 to support structure 14, where each respective one of bolts 101 mounts through a respective bore 148 of support 14 and threadedly engages a second end of a respective spacer bore 161.

Housing 26, circuit board 24, block 22 and heater element 20 are, in that order, fixedly sandwiched between a back plate 30 and mounting plate 18, as shown, In particular, four bolts 200 (only one shown) each respectively are guided through a bore 190 of plate 18 and thread into a respective threaded bore 222 (shown in dotted outline) of block 22. Block 22, thus affixed to plate 18, is coupled in serial combination with board 24, housing 26 and plate 30, where four bolts 300 (only one shown) are each respectively guided through housing 26 and board 24 and threadedly engage block 22 at a respective threaded bore 224. By means of such sandwiching, the diode and resistor leads can be coupled to board 24, as earlier described.

Figure 5:
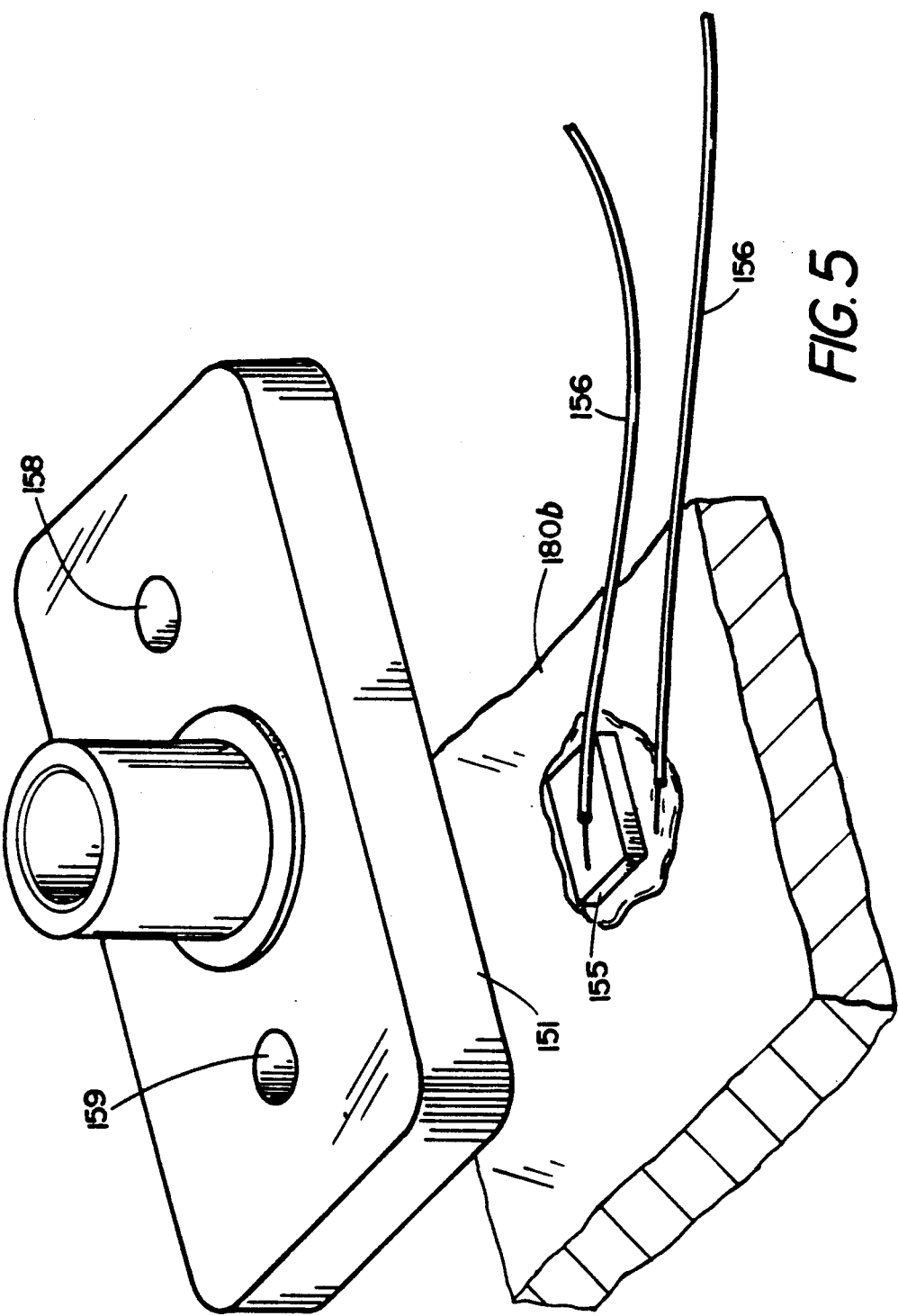
FIG. 5 is a perspective view of diode 15 with thermistor 155 applied adjacent thereto, all upon face 180b of plate 18.

Heater 20 is electrically coupled to a heater control circuit (not shown) which is responsive to heat detected at diode 15. For this purpose, as shown in the perspective view of diode 15 in FIG. 5, thermistor 155 is preferably silver epoxied to plate 18 closely adjacent diode base 151. The thermistor is electrically coupled to a heater control circuit by means of two leads 156, which may be routed off-board via channels 263. (Thermistor 155 preferably comprises a surface mount chip-type thermistor, having rapid response time, such as a Fenwal Electronics NTC thermistor model number 196-202-LAG-001, although suitable alternative components may be employed within the spirit and scope of the present invention.)

The design of lens array 12, cooperating with spacers 16, diode 15 and baseplate 18, acts to counteract the differentials of thermally caused local expansion and/or contraction of various components, thus providing thermal focus compensation. Such compensation accounts for changes in back focal length and in emitter position, caused by temperature changes. In the preferred embodiment, spacers 16 are fabricated from an iron nickel alloy exhibiting a very low coefficient of thermal expansion (commercially available under the tradename "IN- VAR") with plate 18, block 22, support structure 14, housing 26, and barrel 122 preferably being fabricated from commercially pure titanium.

Turning once again to FIG. 2, it will be appreciated that the focal point (f.p.) of elements E1-E4 is desirably located at the diode emitter, where back focal length can be defined as the distance from lens barrel face 124 to a plane through diode emitter 154 perpendicular to axis A—A. Back focal length change is the axial displacement of the lens array focal point (f.p.) away from the diode emitter. Changes in back focal length are influenced by each element's E1-E4 spacing, curvature, and index of refraction as set forth above, while the composition of barrel 122 cooperates with that of spacer 180a' and spacers 16, in calibration with movement of stalk 157, to defeat such axial defocusing. For example, in a preferred embodiment, with a change of temperature from 20° C. to 10° C., the back focal length is calculated to increase 0.457 microns the stalk height to decrease 0.533 microns, spacer 180a' to contract 0.013 microns, and spacers 16 to contract 0.0885 microns. As a result of such compensating interaction, there will be no axial defocus for any temperature changes.

Radial displacement of the focal point in the above example will be negligible. Hence, it will be appreciated that the cross-sectional, radial symmetry of assembly 10 provides for maintaining a constant stress across the assembly 10, thus maintaining the radial alignment of the system. Hence, the sets of receivers 145 and 188 and bores 148, 189, 190, 222 and 224, are symmetrically located, radially, relative to Axis A—A. While flexure 181 is not centered, it favorably diffuses decentering forces on the diode so as to further maintain radial symmetry.

In order to focus assembly 10, all elements are mounted together as described. Thereafter alignment is achieved by performing radial adjustment of diode 15 affixed to plate 18, which is moved relative to structure 14, where pin 160' of spacer 16 loosely fits in bore 188 of plate 18 to facilitate such movement. In a preferred embodiment, a wavefront interferometer is employed in a customary manner to find the desired radial location of diode 15. Thereafter, respective ones of bolts 100 and 101 are tightened to maintain the desired radial position, independent of axial alignment. Axial alignment is achieved by moving lens array 12 along axis A—A until the array focal point falls appropriately upon the diode emitter. Again, a wavefront interferometer may be employed to assist in such alignment. Next, respective bolts (not shown) are guided through respective bores 144 of flange 143 and are threadedly engaged in respective threaded bores 125 of lens 12 to secure the lens to support 14.

After the present invention is assembled and aligned, coupling of lens 12 to support 14 is ruggedized by flowing epoxy, glue or the like, onto a respective pin 146 in a respective receiver 126 via a respective channel 127. Epoxy is also applied at each pin receiver 188 to each pin 160' of each spacer 16 to ruggedize coupling of plate 18 and the spacers 16. It will be thus appreciated that pin 160' only loosely fits in receiver 188 both to permit radial movement during alignment and to allow access to pin 160' for application of epoxy after alignment.

The source assembly's performance is highlighted by the excellent wavefront quality of the output beam, by the maintenance of this beam quality over large swings in laser temperature, by the mechanical robustness of the assembly and by the low loss and low feedback of the optical train. In addition, the laser can be modulated at high rates. When combined with the Hitachi Model HL8314CSP laser diode, output power levels in excess of 25 mW at a 0.86 micron wavelength are possible.

The operating temperature of the laser can be controlled using the integral heater and thermistor in the source assembly. With a properly designed external controller, laser temperature stability on the order of 0.0001° C. can be achieved. When the Hitachi HL8314CSP laser is used, this corresponds to a frequency stability of approximately 4 MHz. Furthermore, given that the: frequency of such a diode is stable at a given operating temperature, and that it is operable in a temperature range of at least 10° to 30° C., the operating frequency of the laser can be advantageously set by means of selecting and maintaining a desired operating temperature, where temperature changes will not affect focal adjustment, the latter owing to the temperature compensating design of the present invention.

The present invention is operable in a number of useful environments, from coherent optical communication, to spectroscopy, to interferometry, and others. It will be appreciated, therefore, that various modifications and equivalents of the present invention are within the spirit and scope of this disclosure, although not specifically set forth herein. Nonetheless, it is intended that the present disclosure be interpreted to cover such modifications and equivalents, limited only by the claims appended hereto.

We claim:

1. A light source assembly comprising:
   a first assembly including a collimating lens,
   a second assembly including a light source, and
   at least one thermal compensating spacer disposed between and separating said first and second assemblies, said spacer compensating for thermal effects in said first and second assemblies so as to maintain a fixed focal adjustment between said light source and said collimating lens when operating temperature of the source changes.

2. The light source assembly of claim 1 wherein said light source comprises a laser which emits light having a frequency that is controlled by the operating temperature of said laser and wherein said second assembly further comprises a heater which controls the operating temperature of said laser.

3. The light source assembly of claim 1 wherein said collimating lens comprises more than one lens element.

* * * * *